United States Patent
Manda et al.

(10) Patent No.: US 9,286,160 B2
(45) Date of Patent: Mar. 15, 2016

(54) SYSTEM AND METHOD FOR PHASE CHANGE MEMORY WITH ERASE FLAG CELLS

(71) Applicants: STMicroelectronics International NV, Amsterdam (NL); STMicroelectronics S.r.l., Agrate Brianza (IT)

(72) Inventors: BharathManoj Manda, Vijayawada (IN); Abhishek Lal, Faridabad (IN); Marco Pasotti, Travaco' Siccomario (IT); Marcella Carissimi, Treviolo (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 113 days.

(21) Appl. No.: 14/175,843

(22) Filed: Feb. 7, 2014

(65) Prior Publication Data

US 2015/0228338 A1 Aug. 13, 2015

(51) Int. Cl.
*G11C 11/00* (2006.01)
*G06F 11/10* (2006.01)
*G11C 13/00* (2006.01)

(52) U.S. Cl.
CPC ........ *G06F 11/1076* (2013.01); *G11C 13/0004* (2013.01); *G11C 13/0069* (2013.01); *G11C 13/0097* (2013.01); *G11C 2211/5646* (2013.01)

(58) Field of Classification Search
CPC ........... G11C 13/0004; G11C 13/0069; G11C 11/5678
USPC .................. 365/163, 185.09, 185.11, 185.17, 365/185.22, 185.29
See application file for complete search history.

(56) References Cited

U.S. PATENT DOCUMENTS

| | | | |
|---|---|---|---|
| 5,371,702 A | 12/1994 | Nakai et al. | |
| 5,715,455 A | 2/1998 | Macon, Jr. et al. | |
| 5,848,009 A * | 12/1998 | Lee et al. | 365/200 |
| 6,144,607 A | 11/2000 | Sassa | |
| 6,195,217 B1 | 2/2001 | Park | |
| 6,816,404 B2 | 11/2004 | Khouri et al. | |
| 7,599,218 B2 | 10/2009 | Rodat et al. | |
| 7,826,302 B2 | 11/2010 | Zhang | |
| 7,869,268 B2 | 1/2011 | Giovinazzi et al. | |
| 7,869,269 B2 | 1/2011 | Donze et al. | |
| 7,940,553 B2 | 5/2011 | Wu et al. | |
| 8,301,977 B2 | 10/2012 | Jagasivmani et al. | |
| 8,452,913 B2 | 5/2013 | Sudo | |
| 8,773,905 B1 * | 7/2014 | Radinski et al. | 365/185.03 |
| 2007/0041249 A1 | 2/2007 | Lusky et al. | |
| 2010/0229001 A1 * | 9/2010 | Park et al. | 713/190 |
| 2012/0106247 A1 * | 5/2012 | Shin | 365/185.03 |
| 2013/0077399 A1 * | 3/2013 | Kang | 365/185.2 |
| 2013/0163329 A1 * | 6/2013 | Tokiwa | 365/185.03 |

FOREIGN PATENT DOCUMENTS

| | | |
|---|---|---|
| EP | 0900440 B1 | 7/2003 |
| EP | 1339111 A1 | 8/2003 |
| WO | 9428551 | 12/1994 |
| WO | 2013098463 A1 | 7/2013 |

* cited by examiner

*Primary Examiner* — Connie Yoha (74) *Attorney, Agent, or Firm* — Slater & Matsil, L.L.P.

(57) ABSTRACT

According to embodiments, a phase change memory (PCM) array includes a plurality of memory cells grouped into memory blocks. In the PCM array, each memory cell is a PCM cell. The PCM array also includes a plurality of erase flag cells. Each erase flag cell of the plurality of erase flag cells is associated with a memory block and indicates whether the memory block stores valid data or erased data.

34 Claims, 7 Drawing Sheets

SYSTEM AND METHOD FOR PHASE CHANGE MEMORY WITH ERASE FLAG CELLS

TECHNICAL FIELD

The present invention relates generally to memory systems, and, in particular embodiments, to a system and method for phase change memory.

BACKGROUND

Most types of computing systems require memory, e.g. an element with the ability to store data or instructions. In some considerations, memory can be divided into two broad categories: volatile and non-volatile memory. Volatile memory requires a power supply to maintain the stored information. Non-volatile memory does not require a power supply and will store the information in whatever states the memory was last set to. Non-volatile memory is, however, generally subject to some form of degradation over time. Non-volatile memory is fundamental in most computing systems and includes many families of memories including but not limited to electrically erasable programmable read-only memory (EEPROM), NOR flash memory, NAND flash memory, phase change memory (PCM), hard drive memory, and even compact disc read-only memory (CD-ROM). Of these, PCM is an emerging memory option for computing systems that offers numerous advantages as technology progresses.

Phase change memory (PCM) is a type of non-volatile memory that uses a phase change in the storage material to store information. Many types of materials may be used and research is ongoing to discover and improve phase change materials, but PCM often uses chalcogenides for storage materials. Chalcogenides are a class of materials that include alloys having an element from group 16 in the periodic table (oxygen, sulfur, selenium, tellurium, polonium). A particular chalcogenide that is often used for PCM is the germanium, antimony, and tellurium alloy $Ge_2Sb_2Te_5$ (more commonly referred to as GST), but many other alloys are possible.

Generally, PCM uses a storage material that can change between a more resistive phase and a more conductive phase. For example, many chalcogenides have a crystalline phase and an amorphous phase. The crystalline phase may have a low resistance and the amorphous phase may have a high resistance. The phase can be changed between amorphous and crystalline by applying an appropriate temperature. Applying a temperature above a crystallization point will cause the chemical structure to become crystalline and applying an even higher temperature above the melting point will cause the chemical structure to become amorphous.

Based on the properties of such materials, memory cells are formed of a storage material such as a chalcogenide between two electrodes. During a read operation, the resistivity will determine the current level passing through the memory cell. Thus a read operation will indicate the phase and therefore the memory state by producing a small or a large current. During a write operation, the two electrodes may apply a first current that may heat the storage material and cause it to crystallize or a second current that may heat the storage material even more and cause it to become amorphous.

SUMMARY OF THE INVENTION

According to embodiments, a phase change memory (PCM) array includes a plurality of memory cells grouped into memory words. In the PCM array, each memory cell is a PCM cell. The PCM array also includes a plurality of erase flag cells. Each erase flag cell of the plurality of erase flag cells is associated with a memory word and indicates whether the memory word stores valid data or erased data.

According to various embodiments, a memory system includes a plurality of phase change memory (PCM) cells arranged in an array of rows and columns, wherein the plurality of memory cells include a plurality of data memory cells, a plurality of erase flag memory cells, and a plurality of error correction cells. The memory system also includes a column decoder coupled to the memory array and configured to select a column from the columns in the array. The memory system further includes a row decoder coupled to the memory array and configured to select a row from the rows in the array. Additionally, the memory system includes a memory logic configured to receive a memory address and control signals, provide a column address to the column decoder, the column address based on the memory address, provide a row address to the row decoder, the row address based on the memory address, and cause memory operations to be performed on the memory cells based on the control signals.

According to various embodiments, a memory system includes a plurality of memory cells and a plurality of flag cells. The memory cells are partitioned into a plurality of memory words and each memory word has an associated flag cell. According to such embodiments, a method of operating the memory system includes writing to a memory word during a write operation, reading from a memory word during a read operation, and modifying a flag cell associated with a memory word during an erase operation on the memory word. Modifying the flag cell is performed while maintaining the plurality of memory cells of the memory word unmodified during the erase operation and the flag cell is modified to indicate that the memory word has been erased.

According to various embodiments, a memory system includes a plurality of memory cells formed on a substrate, a plurality of flag cells formed on the substrate, and an integrated controller formed on the substrate. The plurality of memory cells are grouped together into a plurality of memory words and each flag cell is associated with a memory word. Further, the integrated controller is configured to set a flag cell to an erased value during an erase operation on a memory word associated with the flag cell while maintaining the plurality of memory cells of the memory word unmodified.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely memory system, and more particularly, phase change memory (PCM) systems. Some of the various embodiments described herein include PCM systems and PCM systems with erase flag bits. In other embodiments, aspects may also be applied to other applications involving any type of memory system according to any fashion as known in the art.

Generally, memory systems are designed with a number of standard memory operations. A characteristic of flash memory is a sector erase that consumes little power and occurs relatively quickly. Flash memory is pervasive in numerous applications for mobile electronics, personal computers, and other areas. Other types of memory systems may operate according to different principles than flash memory and a sector erase may be consume more power or require longer erase times in some instances. Thus, various embodiments include a memory system that can emulate the behavior of flash memory during an erase or a sector erase.

According to various embodiments, a memory system includes flag cells and memory cells. The memory cells may be organized and used according to any method for any size and distribution of memory cells. The memory cells are grouped into memory words within the memory system and, in particular embodiments, each memory word has an associated flag cell. In other embodiments, other groups of memory cells can be associated with a flag cell.

In various embodiments, the flag cell associated with a memory word indicates if the memory word is erased. During an erase operation, the flag cells associated with the memory words that are being erased, such as the memory words forming a sector in the memory system, are set to indicate the erased value while the memory cells within each erased memory word is not erased. Thus, in such embodiments, the time to erase a sector and the energy required is reduced to depend on a single flag cell per memory word.

An example embodiment includes phase change memory (PCM). In recent years, the viability of PCM has increased as manufacturing technology has improved and the challenges of using flash based memory has increased due to shrinking memory cell size. Because PCM stores the information in the phase of the storage material and not in a charge, such as for flash memory, or in the magnetic orientation, such as for hard drive memory, PCM offers different performance characteristics for non-volatility, scalability, controllability, write speed, and read speed.

One characteristic of PCM is the addressability of individual bits, i.e. memory cells, for reading, writing, re-writing, and erasing. In PCM, any individual bit can be written and re-written independent of any other bits in the memory and regardless of the value of the bit. In contrast, for flash memory it is often necessary to erase an entire memory sector and re-write it with modified values in order to change a single bit.

An advantage of flash memory is that erase operations are performed quickly because all cells in a sector are erased simultaneously. In PCM, erasing an entire sector may consume more power and time because each individual memory bit is re-written separately.

According to various embodiments, a PCM includes a flag bit indicator for a group of cells, e.g. for each memory word. In other embodiments, the flag bit indicator could be associated with a larger or smaller group of cells. For example, each sector could have a single flag bit indicator or each byte could be associated with its own flag bit indicator. Throughout the examples provided here, the group of cells will be described as a memory word. It is understood, however, that the discussion applies equally to different arrangements of groups.

The flag bit indicates if an associated memory word is erased or valid and enables an emulation of flash memory during erase operations. In various embodiments, a PCM system may be organized to receive sector (or larger block) erase operations in accordance with flash memory operations and will write erase values to the flag bits associated with every memory word in the sector while maintaining the memory cells in the memory words unmodified. In such embodiments, a PCM memory system may emulate a flash memory system.

Figure 1:
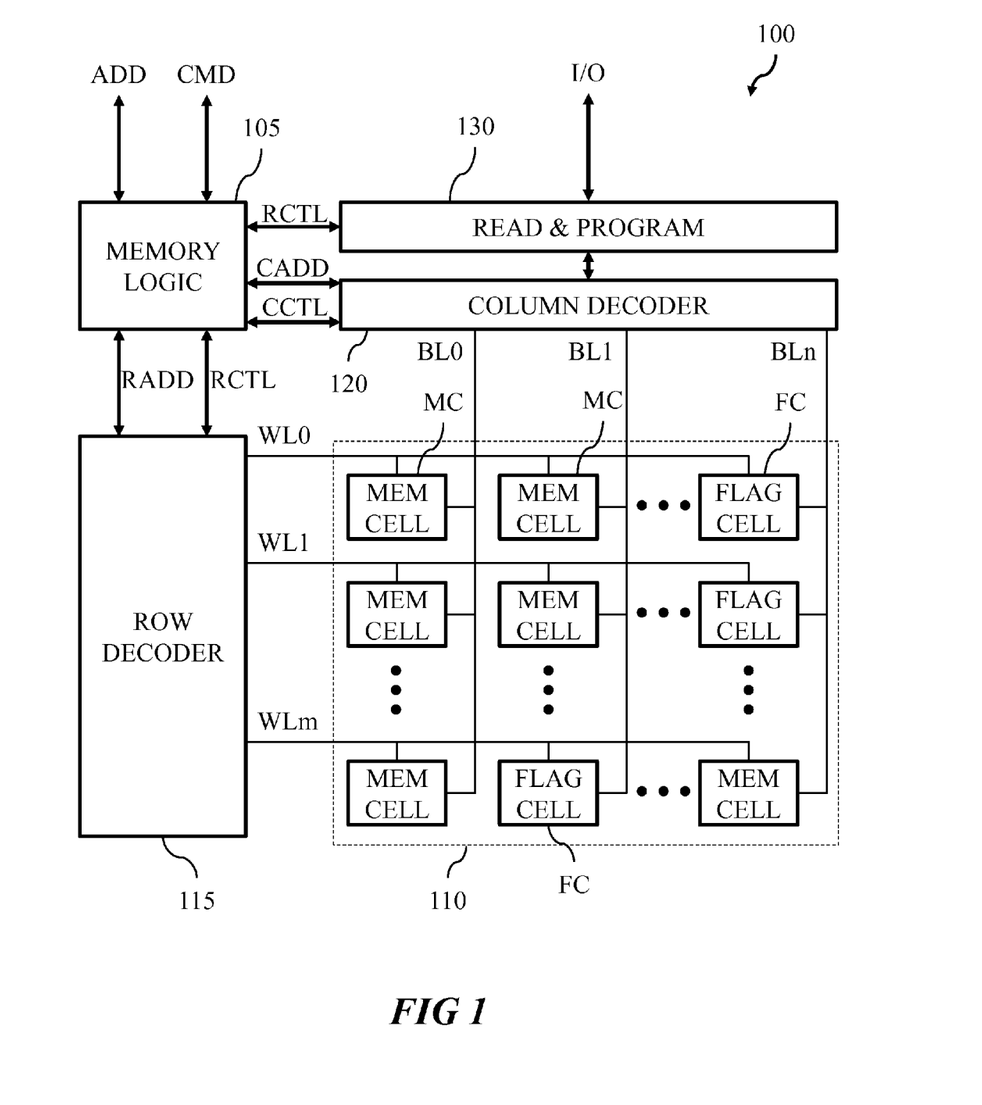
FIG. 1 illustrates a block diagram of an embodiment memory system.

FIG. 1 illustrates a schematic of a semiconductor memory device 100 including memory logic block 105, memory array 110, row decoder 115, column decoder 120, and read and program circuit 130. According to various embodiments, the memory array 110 includes a plurality of memory cells MC and flag cells FC arranged in rows and columns. The semiconductor memory 100 includes a plurality of bit lines BL0-BLn each associated with a respective column of the memory array 110, and a plurality of word lines WL0-WLm each associated with a respective row of the memory array 110. Memory cells MC and flag cells FC may be organized according to different embodiments as is described below. Memory cells MC are grouped into memory words and associated with a flag cell FC for each memory word.

The memory logic block 105 is configured to manage operations to be performed on the memory cells of the memory array 110 in response to commands CMD and addresses ADD received from the outside of the memory. Particularly, memory logic block 105 is configured to receive the commands CMD and accordingly determine an operation (for example, a read operation, a program or write operation, or an erase operation) to be performed on selected memory cells of the memory array 110 identified by the specific address ADD.

In response to the received address ADD, the main logic block 105 generates a corresponding row address RADD and a corresponding column address CADD. The row address RADD is sent to a row decoder 115, which accordingly selects a word line WL form the word lines WL0-WLm, while the column address CADD is sent to a column decoder 120, which accordingly selects a bit line or a set of bit lines BL from bit lines BL0-BLn. In an example embodiment, the number of bit lines (n+1) is 2048 and the number of word lines (m+1) is 256 for a 512 Kb memory.

Moreover, the memory logic block 105 is coupled with a read and program circuit 130 including all the components (such as sense amplifiers, comparators, charge pumps, reference cells, pulse generators, and the like) which are used to program the memory cells MC, or to read the values stored therein. Based on the received command CMD, memory logic block 105 controls read and program circuit 130 for performing a reading or a programming operation on the memory cells MC associated with the selected word line WL and bit line BL or bit lines BL. Particularly, read and program circuit 130 is activated by memory logic block 105 through a read/write command signal RCMD for performing a read operation, a write operation, or an erase operation, for example, based on the read/write command signal RCMD, which is generated by memory logic block 105 according to the received command CMD.

In an embodiment, memory logic block 105 may receive a command set designed for a flash memory. For example, memory logic block 105 may receive an erase sector command on command line CMD. In response, memory logic block 105 may control read and program circuit through row control signals RCTL to set flag cells FC associated with the memory sector being erased. Thus, in some embodiments, semiconductor memory 100 may emulate flash memory systems and operate with flash memory system commands.

The semiconductor memory 100 depicted in FIG. 1 may be a PCM, wherein each memory cell MC is made of a phase change material. Typically, the phase change material includes a chalcogenide (such as the common alloy GST, e.g. $Ge_2Sb_2Te_5$). Without descending to particulars known in the art, the phase change material can be reversibly switched between a generally amorphous, disordered phase and a generally crystalline, high ordered phase. The two phases of the material exhibit different electrical characteristics. In particular, the material in the amorphous phase has a high resistivity (defining a reset state associated with a first logic value, for example, "0"), whereas the material in the crystalline phase has a low resistivity (defining a set state associated with a second logic value, for example, "1"). The various embodiments and combinations thereof described herein are not limited to PCM. As one of ordinary skill in the art will recognize, the concepts presented herein are applicable to any type of memory or semiconductor memory, and may be useful in applications of non-volatile and volatile memories alike.

According to various embodiments, row decoder 115 receives row address RADD and row control signals RCTL from memory logic block 105 and column decoder receives column address CADD and column control signal CCTL from memory logic 105. Column and row decoder 120 and 115 may be configured and operate according to numerous methodologies as is known in the art. In various embodiments, address ADD, column address CADD, and row address RADD may be multiplexed, divided bus signals, and/or decoded or partially decoded signals. The address lines are illustrative and variations are envisioned according to various embodiments.

Further, the organization of control and command signals CMD, RCMD, RCTL, and CCTL are also illustrative and variations are envisioned. For example, control and command signals CMD, RCMD, RCTL, and CCTL may include separate enable signals and select signals for each block. In various embodiments, read and program circuit 130, column decoder 120, and row decoder 115 include voltage supply connections VDD (not shown), high voltage supply connections VX (not shown), and/or reference voltage connections GND (not shown) for use in the various operations of a memory system.

Figure 2A:
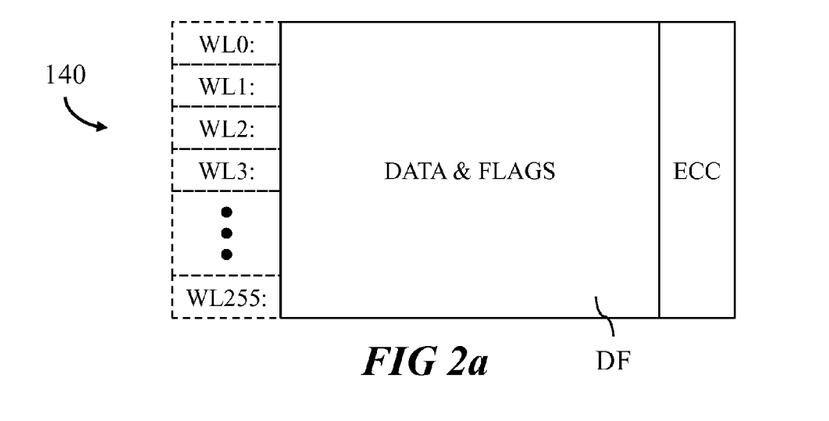
FIGS. 2*a*-2*c* illustrate block diagrams of an embodiment memory array.
Figure 2B:
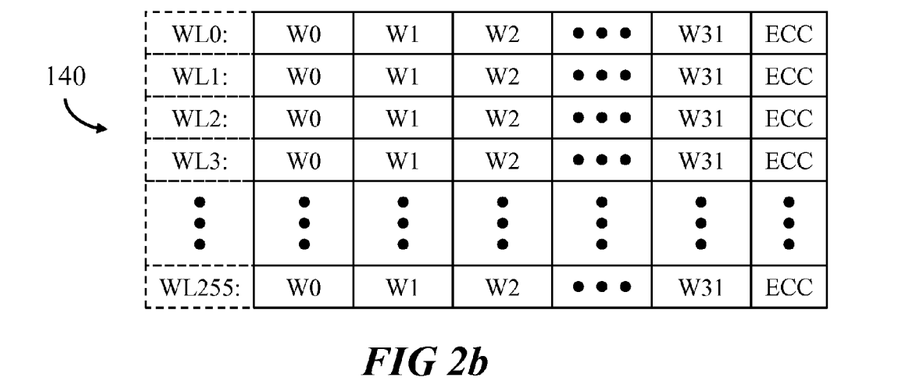
Figure 2C:
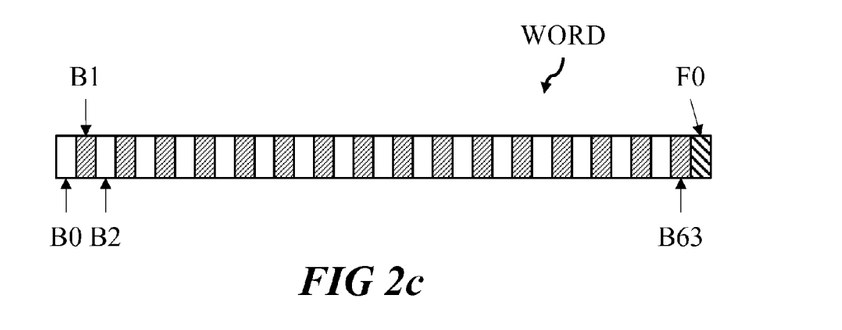

FIGS. 2a-2c, collectively referred to as FIG. 2, illustrate block diagrams of an embodiment memory array 140 according to one implementation of memory array 110 as described in reference to FIG. 1. FIG. 2 illustrates memory array 140 according to a first memory organization. According to various embodiments, memory array 140 includes 256 word lines WL0-WL255 dividing up memory array 140 by rows. Other memory sizes can be designed and other organizations are envisioned.

As shown, memory array 140 includes a primary data and flag memory block DF including numerous memory and flag cells, i.e. memory bits and flag bits. According to such an embodiment, there is no division in memory array 140 between flag bits and memory bits. Also shown, error code correction (ECC) block ECC is included in memory array 140 and serves to verify and correct errors that occur within the memory and flag cells in data and flag block DF. The ECC block may be located and/or partitioned differently in various embodiments as is known in the art. Further, the operation of ECC block may be configured according to any principles known in the art and is not described in detail herein.

FIG. 2a shows the organization of this embodiment more broadly while FIG. 2b illustrates memory array 140 with more detail. In this example, the memory includes memory words W0-W31 on each word line WL0-WL255 and ECC blocks at the end of every word line. As shown, there are no flag blocks in memory array 140. In this regard, memory array is arranged according to a typical memory array with memory words on each word line and ECC for each memory word. In various embodiments, memory words W0-W31 include flag cells in every word. This feature is more clearly shown in FIG. 2c.

FIG. 2c illustrates a memory word W0-W31 from any word line WL0-WL255 in memory array 140. According to various embodiments, each memory word includes 64 memory cells B0-B63 and a single flag cell as shown. In such embodiments, the memory cells B0-B63 operate according to typical cells in a memory word while the flag cell indicates if the memory word is erased. For example, erasing a memory word, such as memory word W2 in word line WL1, includes setting the flag cell in memory word W2 to an erased value. Thereafter, all operations on memory word W2 will indicate that memory word W2 is erased. In some embodiments, an erased memory word has logic '1' values written to every memory cell B0-B63. In such a case, if the flag cell is set to a value of erased, a read operation on the "erased" memory word associated with the flag cell will return all logic '1' values, regardless of the physical state of the memory word. Thus, memory words may be erased by a single erase operation on the associated flag cell within the memory word while leaving the memory cells B0-B63 in each memory word with the original un-erased values. The respective logic values '0' and '1' may be interchanged in different embodiments.

Figure 3A:
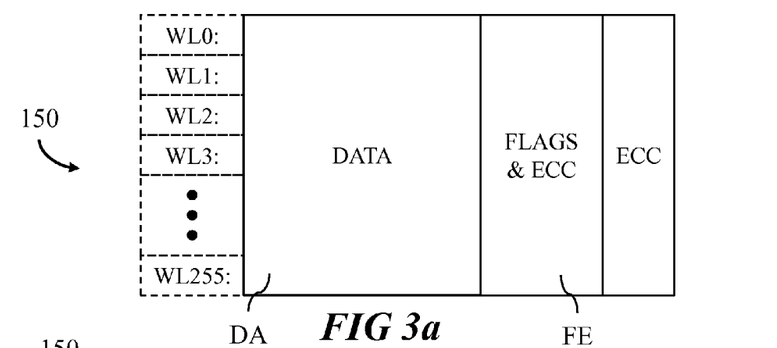
FIGS. 3*a*-3*d* illustrate block diagrams of another embodiment memory array.

FIG. 2 illustrates an embodiment memory system with a representative size of 256 word lines, 32 words per line, and 64 data bits per word, plus flag bits and error code correction bits. These numbers are illustrative and any size of memory system is envisioned within the scope of the embodiments and combinations described herein. Specifically, any number of word lines, words per line, and data bits per word may be included in various embodiments. Further, ECC can be arranged according to any known system or method and the location of ECC blocks in the figures is illustrative and not exclusive. For example, according to one embodiments, ECC is applied to a 64 bit memory word and the associated flag cell making up 65 bits for ECC. According to one specific embodiment, 7 ECC bits are capable of applying ECC to a 64 bit memory word and a single flag cell FIG. 3, which includes FIGS. 3a-3d, illustrates block diagrams of another embodiment memory array 150 according to another implementation of memory array 110 as described in reference to FIG. 1. FIG. 3a more generally illustrates memory array 150 according to a second memory organization. According to various embodiments, memory array 150 includes 256 word lines WL0-WL255 dividing up memory array 150 by rows. As shown, memory array 150 includes a data memory block DA including numerous memory cells, i.e. memory bits, and a flag and ECC block FE including numerous flag cells, i.e., flag bits. According to such an embodiment, memory array 150 is divided between flag cells and memory cells. Also shown, the ECC block is included in memory array 150 and serves to verify and correct errors that occur within the data memory block DA. The ECC block, if included, may be located and/or partitioned differently in various embodiments as is known in the art. Further, the operation of ECC block may be configured according to any principles known in the art and is not described in detail herein.

Figure 3B:
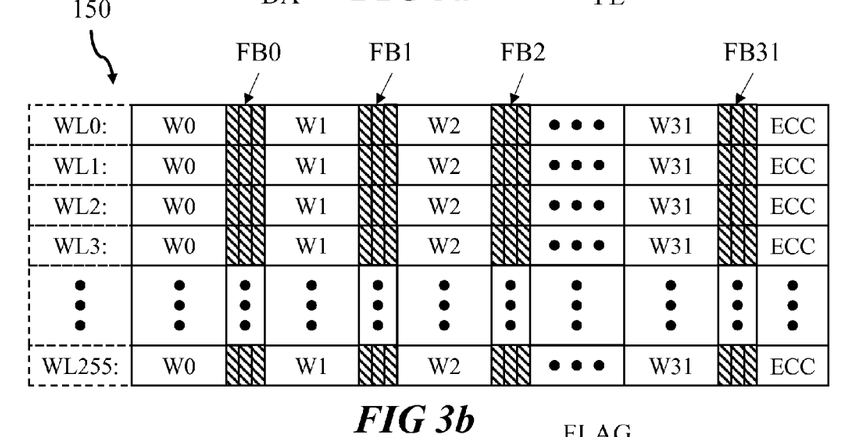

FIG. 3b illustrates memory array 150 in an embodiment showing more detail and including memory words W0-W31 on each word line WL0-WL255 and ECC blocks at the end of every word line. Also shown are flag blocks FB0-FB31 on each word line WL0-WL255. Flag blocks FB0-FB31 are included in flag and ECC block FE in FIG. 3a. The individual flag blocks FB0-FB31 are inserted between each memory word W0-W31 in some embodiments. In other embodiments, flag blocks FB0-FB31 are grouped at the end of the word line before or after the ECC block. These embodiments are illustrative to show that flag blocks may be situated anywhere in memory array 150. As is described further below in reference to FIGS. 3c and 3d, each flag block is associated with a memory word. For example, memory word W31 on word line WL0 is associated with flag block FB31 on word line WL0.

Figures 3C, 3D:
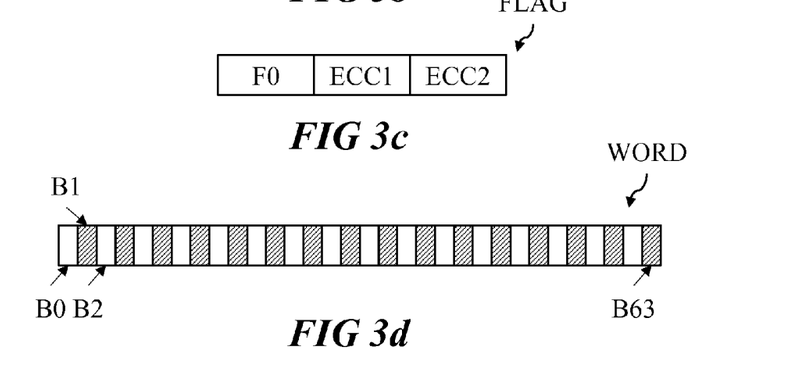

FIG. 3c illustrates a flag block FB0-FB31 from any word line WL0-WL255 in memory array 150. According to various embodiments, each flag block includes a single flag cell F0 and two dedicated ECC cells ECC1 and ECC2. Each flag block FB0-FB31 is associated with a corresponding memory word. The flag cell F0 of a specific flag block indicated if the associated memory word is erased, as described above. In such embodiments, the flag cell associated with a memory word is not included in the memory word, but is included in the flag block associated with the memory word.

FIG. 3d illustrates a memory word W0-W31 from any word line WL0-WL255 in memory array 150. According to various embodiments, each memory word includes 64 data or memory cells B0-B63 and a no flag cell as shown. In such embodiments, the memory words W0-W31 are standard memory words with standard memory cells B0-B63 operating according to typical cells in a memory word while associated flag block FB0-FB31 with flag cells F0 indicate if the memory words are erased. For example, erasing a memory word, such as memory word W2 in word line WL1, includes setting flag cell F0 in flag block FB2 on word line WL1 to an erased value. Thereafter, all operations on memory word W2 will indicate that memory word W2 is erased.

In some embodiments, an erased memory word has logic '1' values written to every memory cell B0-B63. In such a case, if the flag cell F0 is set to a value of erased, a read operation on the "erased" memory word associated with the flag block containing the flag cell F0 will return all logic '1' values, regardless of the physical state of the memory word. Thus, memory words may be erased by a single erase operation on the flag cell in the associated flag block within the memory word while leaving the memory cells B0-B63 in each memory word with the original un-erased values. The respective logic values '0' and '1' may be interchanged in different embodiments.

FIG. 3 illustrates an embodiment memory system with a representative size of 256 word lines, 32 words per line, and 64 data bits per word, plus flag blocks and error code correction bits. As before, these details are illustrative and any size of memory system is envisioned within the scope of the embodiments and combinations described herein. Specifically, any number of word lines, words per line, and data bits per word may be included in various embodiments. Further, ECC may be arranged according to any known system or method and the location of ECC blocks in the figures is illustrative and not exclusive.

Figure 4A:
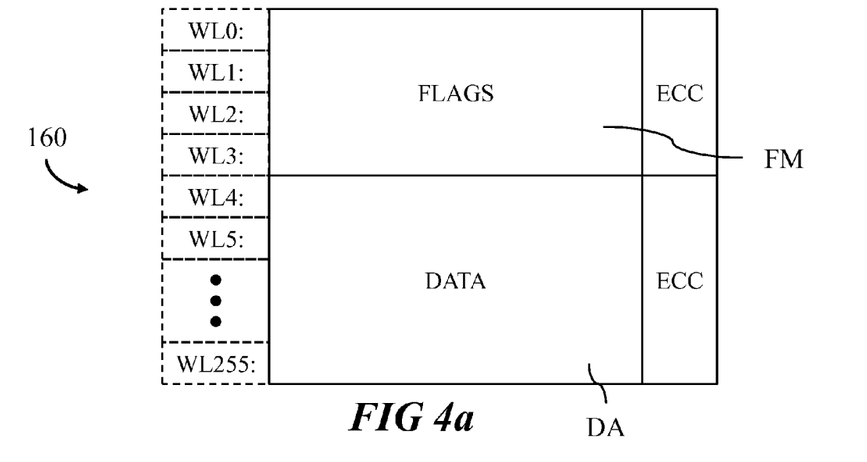
FIGS. 4*a*-4*c* illustrate block diagrams of a further embodiment memory array.
Figure 4B:
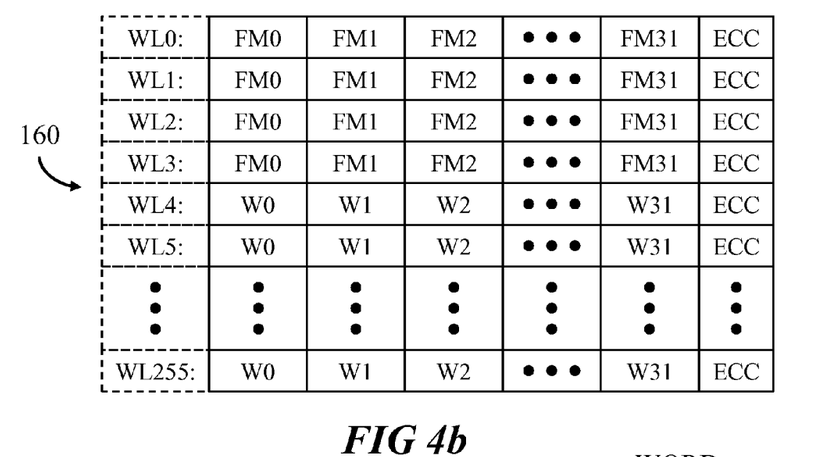
Figure 4C:
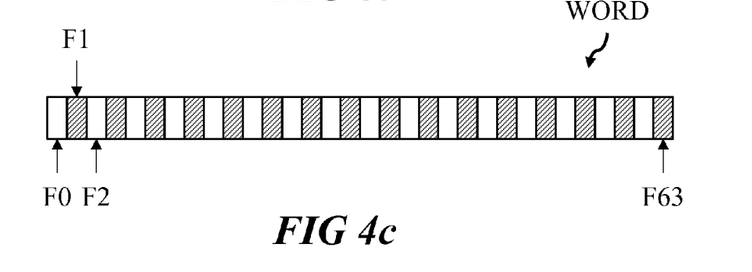

FIG. 4, which includes FIGS. 4a-4c, illustrates block diagrams of a further embodiment memory array 160 according to another implementation of memory array 110 as described in reference to FIG. 1. FIG. 4a illustrates memory array 160 according to a third memory organization. According to various embodiments, memory array 160 includes 256 word lines WL0-WL255 dividing up memory array 160 by rows. As shown, memory array 160 includes a data memory block DA including numerous memory cells, i.e. memory bits, and a flag matrix FM including numerous flag cells, i.e., flag bits. According to such an embodiment, memory array 160 is divided between flag cells and memory cells. Also shown, the ECC block is included in memory array 160 and serves to verify and correct errors that occur within data memory block DA and flag matrix FM. The ECC block may be located and/or partitioned differently in various embodiments as is known in the art. Further, the operation of ECC block may be configured according to any principles known in the art and is not described in detail herein.

FIG. 4b illustrates memory array 160 in an embodiment showing more detail and including memory words W0-W31 on word lines WL4-WL255 and flag matrix words FM0-FM31 on word lines WL0-WL3. Flag matrix words FM0-FM31 are included in flag matrix FM in FIG. 4a. As shown, flag matrix words FM0-FM31 are grouped together at the top of memory array 160. These embodiments are illustrative to show that the flag matrix may be situated anywhere in memory array 160. As will is described further below in reference to FIG. 4c with 4b, each memory word in memory array 160 still has an associated flag cell. All the flag cells are grouped together in flag memory FM.

FIG. 4c illustrates a flag matrix word from any word line WL0-WL3 in memory array 160. According to various embodiments, each flag matrix word includes 64 flag cells F0-F63. Each flag cells F0-F63 is associated with a corresponding memory word. The flag cell of a specific flag matrix word indicates if the associated memory word is erased. In such embodiments, the flag cell associated with a memory word is not included in the memory word, but is included in the flag matrix word and each flag matrix word has 64 flag cells to associated with memory words through memory array 160.

According to various embodiments, each memory word includes 64 data or memory cells B0-B63 and a no flag cell as illustrated in FIG. 3d. In such embodiments, the memory words W0-W31 are standard memory words with standard memory cells B0-B63 operating according to typical cells in a memory word while associated flag cells in flag matrix FM indicate if the memory words are erased. In such embodiments, all the flag cells are stored together in the flag matrix. If a flag cell associated with a specific memory word is set to an erased value, all operations on the specific memory word will indicate that the memory word is erased. In some embodiments, an erased memory word has logic '1' values written to every memory cell B0-B63 in the memory word. In such a case, if the flag cell in the flag matrix FM is set to a value of erased, a read operation on the "erased" memory word associated with the flag cell will return all logic '1' values, regardless of the physical state of the memory word. Thus, memory words may be erased by a single erase operation on the flag cell in the associated flag block within the memory word while leaving the memory cells B0-B63 in each memory word with the original un-erased values. The respective logic values '0' and '1' may be interchanged in different embodiments.

As before, FIG. 4 illustrates an embodiment memory system with a representative size that is illustrative and any size of memory system is envisioned with any number of word lines, words per line, and data bits per word, along with any ECC arrangement.

The organization of flag cells in the different memory arrays 140, 150, and 160 illustrated in FIGS. 2-4 cause different operation of the error correcting code (ECC) for each system. Memory system 140 may include ECC that treats each memory word W0-W31 as a 65 bit word including the flag bit. In such an embodiment, no extra ECC is required beyond that associated with each memory word. Memory system 150 may include standard ECC for each 64 bit memory word W0-W31 on each word line, but also includes the dedicated ECC1 and ECC2 for each flag block FB0-FB31, separate from memory words W0-W31. Likewise, memory system 160 includes a dedicated flag matrix that has dedicated ECC for the flag matrix. In such an embodiment, standard ECC for each flag matrix word may be included that operates in the same was as ECC of a memory word.

Figure 5:
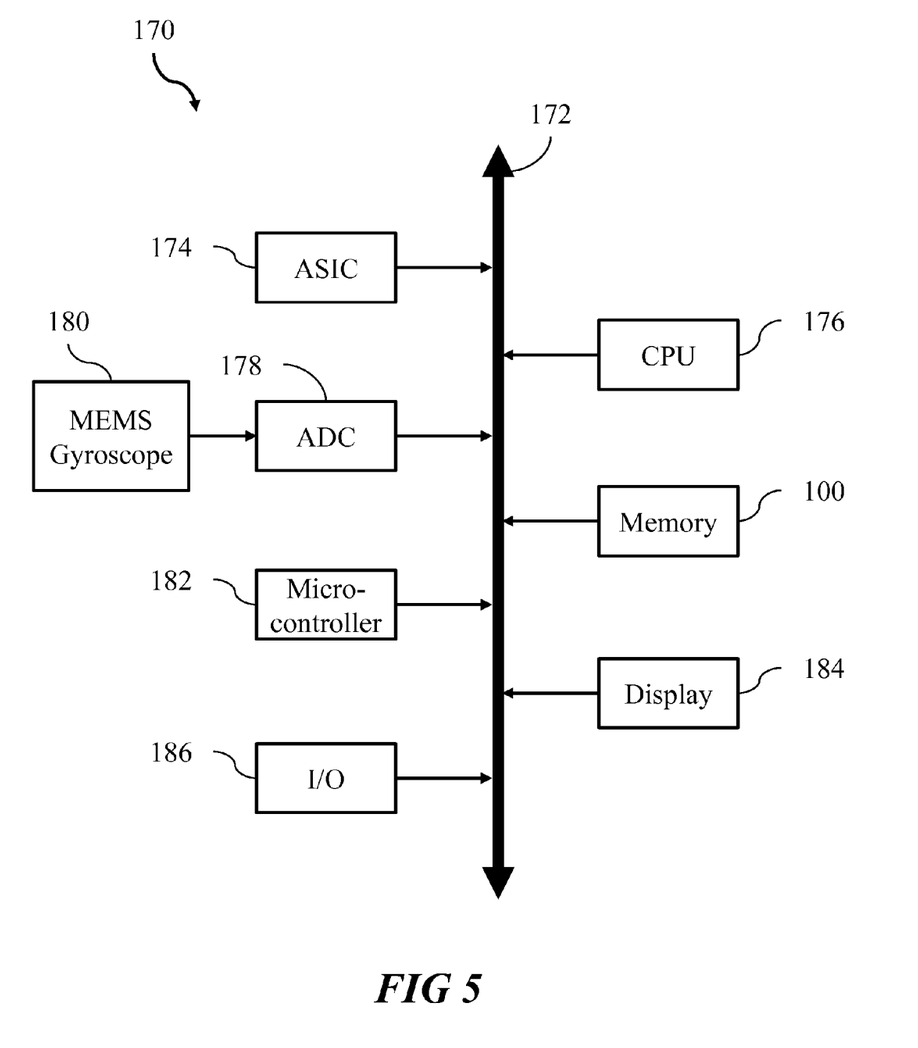
FIG. 5 illustrates a block diagram of an electronic system including an embodiment memory system.

FIG. 5 illustrates a block diagram of an electronic system 170 including an embodiment memory system 100. According to various embodiments, memory system 100 is connected to bus 172 in order to send and receive information to and from other components attached to bus 172. FIG. 5 is illustrative and depicts various components 174-186 that may be connected to bus 172. In other embodiments, not all the components 174-186 are included in electronic system. In further embodiments, other components that are not shown may be included in electronic system 170.

In various embodiments, memory system 100 is as described herein in reference to the other figures. Memory 100 is a primary memory for ASIC 174, CPU 176, analog to digital converter (ADC) 178 and microelectromechanical system (MEMS) gyroscope 180, microcontroller 182, display 184, and input/output (I/O) interface 186. In other embodiments, memory 100 is a secondary memory and another memory, such as a dynamic random-access memory (DRAM) is included (not shown) as a primary memory. When a primary and a secondary memory are both included, the primary memory serves as a working memory that stores and provides working data as a temporary fast storage for the various components 174-186 on bus 172 while the secondary memory stores all data and will provide copied blocks of relevant data to the primary memory as requested by various processing and control blocks, such as microcontroller 182, CPU 176, or ASIC 174, for example.

In various embodiments, electronic system 170 is illustrative of various potential usage systems and should not be construed in a limiting sense. As one skilled in the art will readily appreciate, embodiment memory 100 may be included in a plethora of different systems. For example, electronic system 170 may depict a personal mobile electronic system such as a cell phone, tablet, or mp3 player; a computer such as a laptop or desktop; and/or any type of embedded system for general or specific uses in innumerable environments. Again, the components of electronic system 170 are illustrative and may be replaced or rearranged such that, for example, MEMS gyroscope may be replaced or accompanied by other components that provide analog signals and/or sensors, such as a microphone, accelerometer, touch screen, or other component.

Figure 6:
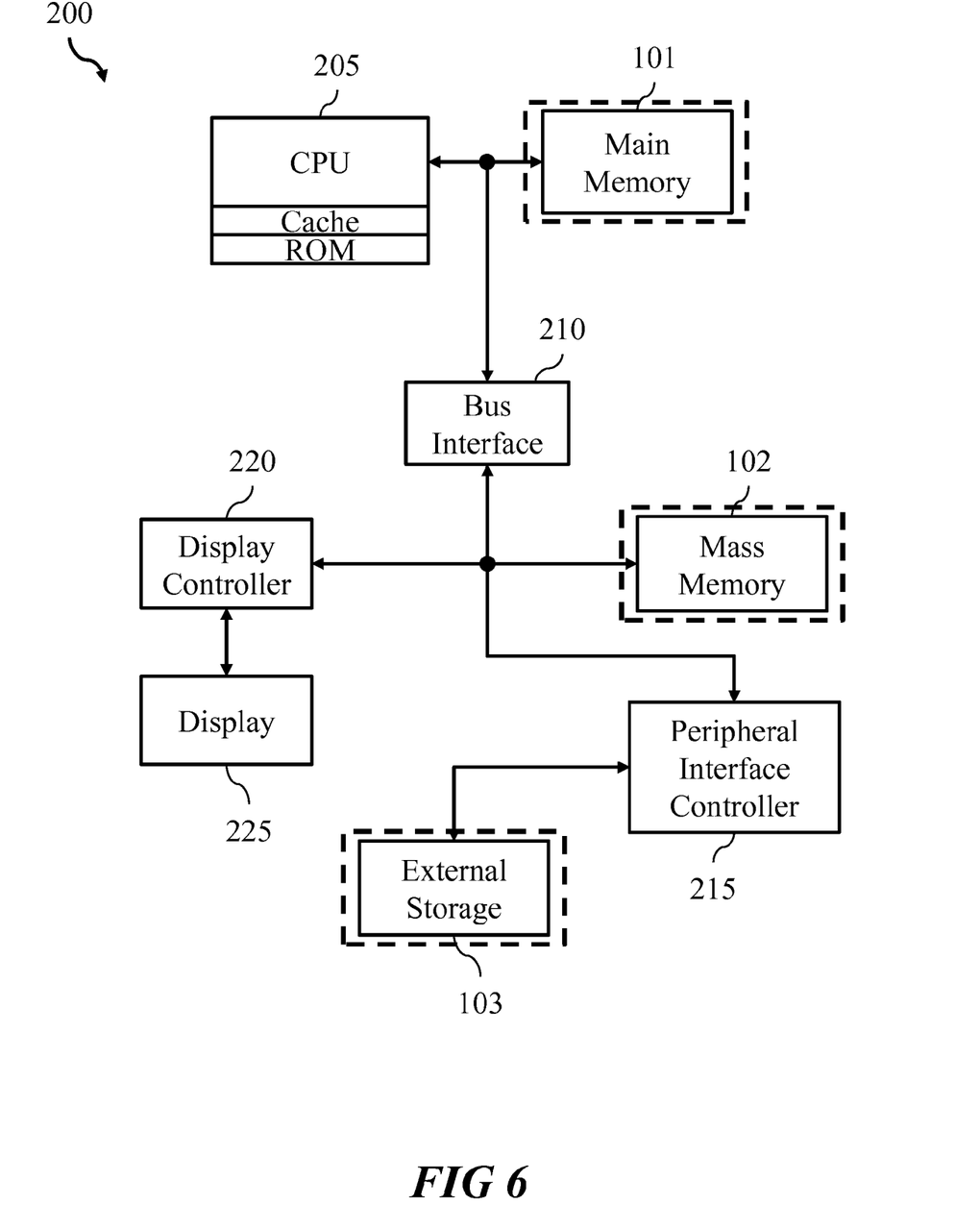
FIG. 6 illustrates a block diagram of a computer system including multiple embodiment memory systems.

FIG. 6 illustrates a block diagram of a computer system 200 including multiple embodiment memory systems 101, 102, and 103. According to various embodiments, computer system 200 illustrates a simplified block diagram of a modern computer system including CPU 205, bus interface 210, display controller 220 and display 225, peripheral interface controller 215, and memory systems 101, 102, and 103. Memory systems 101, 102, and 103 may each be implemented as an embodiment memory system with erase flags as described herein in reference to the other figures.

In a conventional computer system, main memory 101 is implemented as DRAM, mass memory 102 is implemented as a hard drive device (HDD) or a solid-state drive (SSD), and external storage is a USB flash drive. According to various embodiments, any or all of these memories are replaced by PCM with flag bits as described in reference to FIGS. 1-4. For example, main memory 101 may include a PCM with flag bits indicating erased memory words and mass memory 102 may also include a PCM with flag bits. In some embodiments, main memory 101 may be implemented as a DRAM and mass memory 102 may be implemented as a PCM with flag bits. In a further embodiment, main memory 101 and mass memory 102 may be combined as a PCM with flag bits to produce a single system memory that replaces the primary and secondary memories. According to other embodiments, memory systems 101, 102, and 103 may be implemented as other non-PCM type systems with erase flags as described herein.

Figure 7:
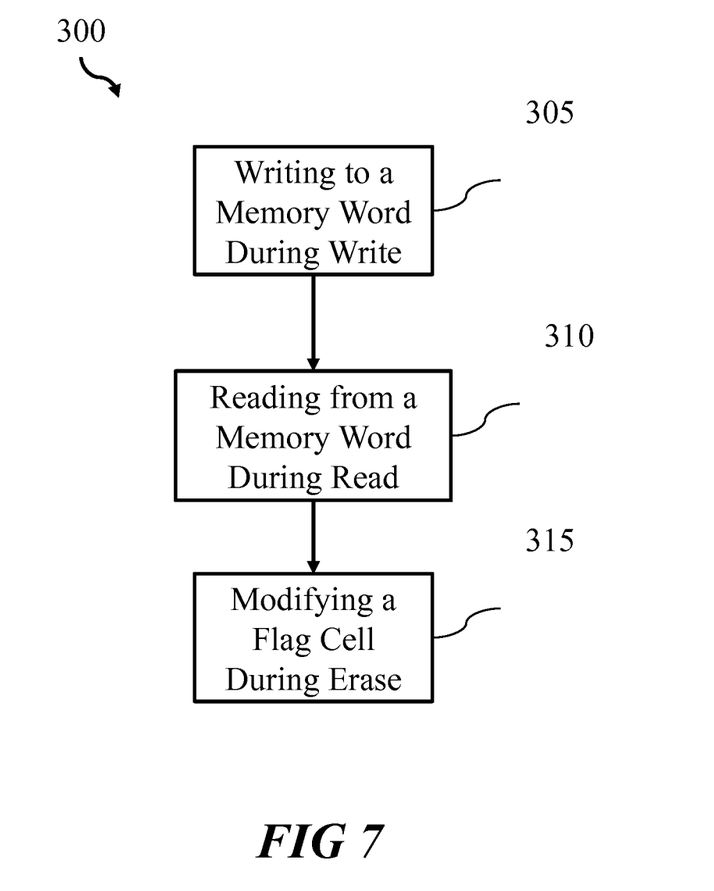
FIG. 7 illustrates a block diagram of a method of operation for an embodiment memory system.

FIG. 7 illustrates a block diagram of a method of operation 300 for an embodiment memory system including steps 305, 310, and 315. According to various embodiments, the memory system being operated includes a plurality of memory cells and a plurality of flag cells. The memory cells are partitioned into a plurality of memory words and each memory word has an associated flag cell. Step 305 includes writing to a memory word during a write operation.

As described hereinabove, various embodiment memory systems are envisioned with various organizations. In a particular embodiment using illustrative sizes, 64 bit memory words are associated with a single flag bit, i.e. 64 memory cells and 1 flag cell. Step 305 may include writing to the 64 bit memory word. In such embodiments, a write operation command with an address may be received at the memory system. The received command is interpreted through a memory logic, e.g., as described in reference to memory logic 105, and further commands and specific addresses are sent to additional functional blocks within the memory system in order to perform the write operation.

In some embodiments, the flag cell may be set during a write operation in order to indicate that the associated memory word is not an erased value (i.e., 0 or 1 in different embodiments). For example, when a memory word is written, the flag cell associated may be set to indicate a non-erased value. In some cases the memory word may have been previously written and the flag cell set to indicate a non-erased value. If a write operation is performed on an already written memory word, the flag cell associated with the memory word may not need to be set again. In such cases, some embodiment memory systems may check the value of the flag cell during a write operation on the associated memory word and set it to a non-erased value if it does not already indicate a non-erased value. If the flag cell does indicate the non-erased value, the memory system may leave the flag cell unmodified. In other embodiments, the flag cell is set to a non-erased value during write operations on the associated memory word regardless of the flag cell's previous value.

Step 310 includes reading from a memory word during a read operation. Similar to step 305, performing a read operation in step 310 may include receiving a specific command and address, interpreting the command and address, and providing specific commands and addresses to other functional blocks within the memory system in order to perform the read operation. Once the value is read, it may be fed to an output bus for system usage. According to various embodiments, read operations may or may not affect the memory cells. It is possible that a read operation may be accompanied by a refresh operation in some specific technologies.

Step 315 includes modifying a flag cell associated with a memory word during an erase operation on the memory word while maintaining the plurality of memory cells of the memory word unmodified during the erase operation. In such embodiments, the flag cell is modified to indicate that the memory word has been erased. As described hereinabove, erase operations on cells may cause delay. Thus, setting only the flag cell associated with a memory word during an erase operation allows the memory word to remain unmodified and prevents the extra delay of erasing all the memory cells in the memory word. For example, is the memory word includes 64 memory cells and has one flag cell associated with it, an erase operation only requires one cell to be erased in some embodiments instead of 64 cells.

Also as described above, a flash memory system often erases whole sectors in the memory system. In some technologies, sector erases are necessary for writing data to any words in the sector. For this reason and others, many systems that use flash memory perform sector erase operations frequently during operation. According to various embodiment memory systems, a flash memory type erase, e.g., a sector erase, may be received by an embodiment memory system and the erase operation may be performed on a plurality of memory words included within the sector according to step 315. In other words, a sector erase may be performed by setting the flag cells associated with each memory word to a value indicating the data is erased while leaving the memory cells unmodified.

As an example, for a 4 KB sector (32,768 memory cells) made up of 64 bit words, the sector includes 512 memory words. During an embodiment erase operation, only 512 flag cells are set to the erase value instead of the 32,768 memory cells in the sector. In such an embodiment, the flag cells indicate that the sector contains erased values, but the delay caused by erasing all 32,768 memory cells in the sector may be avoided. As mentioned above, in other embodiments any memory word size or sector size could be used. Although steps 305, 310, and 315 are shown in sequential order, they may be performed in any order, either individually or together.

Embodiments have been discussed in terms of PCM. The concepts discussed herein can also be applied to other types of memory systems such as MRAM, CBRAM, FERAM, RRAM, DRAM, SRAM, hybrid memories, or any type of volatile or non-volatile memory.

The various embodiments described herein have been discussed in terms of some specific embodiments involving single flag cells associated with every memory word. The concepts discussed herein can also be applied to other memory organizations. By way of example, some embodiments group a flag cell with an entire memory sector, such as a 4 KB memory sector. In other embodiments, each byte is associated with a unique flag cell. In some embodiments, each memory cell could be associated with a unique flag cell. Further, a single flag cell could be associated with multiple bytes, words, or sectors. For example, a flag cell could be associated with a byte in each of a group of memory words.

In various embodiments, the flag cells and the memory cells are not necessarily the same type of memory. Embodiments are discussed generally herein in reference to PCM arrays. In other embodiments, the flag cells may be implemented as any type of memory, such as DRAM, SRAM, flash memory, or any other type, while the memory cells are also implemented as any type of memory, but not necessarily the same memory type. For example, the memory cells may be implemented as PCM cells and the flag cells may be implemented as flash, DRAM, or SRAM.

In another embodiment, the flag cells may be used as temporary indicators of erased data and the memory cells which are indicated as erased may be physically erased at a later time. For example, if a flag cell indicates that a memory word is erased, the memory word may initially remain unmodified. At a later time, such as when system usage is decreased or when the system is in standby, the cells in the memory word may also be set to the erased value.

Advantages of the various embodiments described herein include decreased power consumption during erase operations, decreased time to complete an erase operation, and emulation of flash memory behavior.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A memory array comprising:
a plurality of memory cells arranged in groups, each memory cell comprising a phase change memory cell;
a plurality of erase flag cells, wherein each erase flag cell of the plurality of erase flag cells is associated with a group of the memory cells and indicates whether the group of the memory cells is to be treated as valid or erased; and
a memory control circuit configured to set an erase flag cell to an erased value during an erase operation on the group of the memory cells associated with the erase flag cell without modifying the plurality of memory cells of the group of the memory cells associated with the erase flag cell.

2. The memory array of claim 1, wherein each group of memory cells comprises a memory word.

3. The memory array of claim 2, wherein each memory word comprises the erase flag cell associated therewith.

4. The memory array of claim 3, further comprising error code correction (ECC) applied to each memory word, wherein the ECC applied to each memory word is applied to the erase flag cell in the memory word.

5. The memory array of claim 3, further comprising error code correction (ECC) cells formed in the memory array, wherein the ECC cells are dedicated to be used for ECC.

6. The memory array of claim 2, wherein each memory word is separate from the erase flag cell associated therewith.

7. The memory array of claim 6, further comprising error code correction (ECC) applied to each memory word and ECC applied to each erase flag cell.

8. A memory array comprising:
a plurality of memory cells arranged in groups, each memory cell comprising a phase change memory cell;
a plurality of erase flag cells, wherein each erase flag cell of the plurality of erase flag cells is associated with a group of the memory cells and indicates whether the group of the memory cells is to be treated as valid or erased, each group of memory cells comprises a memory word, and each memory word is separate from the erase flag cell associated therewith; and error code correction (ECC) memory cells formed in the memory array, wherein each erase flag cell has two dedicated ECC memory cells.

9. The memory array of claim 1, further comprising a flag matrix, wherein the flag matrix comprises the plurality of erase flag cells.

10. The memory array of claim 9, further comprising error code correction (ECC) applied to each memory word and ECC applied to each erase flag cell within the flag matrix.

11. The memory array of claim 9, wherein the erase flag cells are grouped in erase flag words within the flag matrix.

12. The memory array of claim 11, further comprising ECC memory cells formed in the memory array, wherein each erase flag word and each memory word has dedicated ECC memory cells.

13. A memory circuit comprising:
an array of non-volatile memory cells arranged in rows and columns, wherein the memory cells comprise a plurality of memory bits and a plurality of erase flags;
a column decoder coupled to the array and configured to select a column from the columns in the array;
a row decoder coupled to the memory array and configured to select a row from the rows in the array; and
memory control circuitry configured to:
receive a memory address and control signals,
provide a column address to the column decoder, the column address based on the memory address,
provide a row address to the row decoder, the row address based on the memory address, and
cause memory operations to be performed on the memory cells based on the control signals, the memory operations comprising an erase operation that includes modifying a first erase flag associated with a first group of the plurality of memory bits, wherein the first erase flag is modified to indicate that the first group of the plurality of memory bits has been erased, and wherein the plurality of memory bits of the first group of the plurality of memory bits are not modified during the erase operation.

14. The memory circuit of claim 13, wherein each of the array of non-volatile memory cells comprises an array of phase change memory cells.

15. The memory circuit of claim 13, wherein the memory bits are grouped together into memory words and each memory word comprises an erase flag memory cell.

16. The memory circuit of claim 13, wherein the memory bits are grouped together into memory words and an erase flag memory cell is dedicated to each memory word and separated from the memory word to which it is dedicated.

17. The memory circuit of claim 13, wherein the memory bits are grouped together into memory words and the erase flags are grouped together into a flag matrix, each erase flag memory cell being dedicated to an associated memory word.

18. A method of operating a memory circuit comprising a plurality of memory cells and a plurality of flag cells, wherein the memory cells are partitioned into a plurality of groups of memory cells and each group of memory cells has an associated flag cell, wherein the method comprises:
receiving an erase instruction associated with a first group of the memory cells; and
modifying a first flag cell associated with the first group of the memory cells in response to the erase instruction, the first flag cell modified to indicate that the first group of the memory cells has been erased, wherein the plurality of memory cells of the first group of the memory cells are not modified in response to the erase instruction.

19. The method of claim 18, wherein, prior to receiving the erase instruction, the method further comprises:
receiving a write instruction associated with the first group of the memory cells; and
in response to the write instruction, writing to each memory cell in the first group of the memory cells.

20. The method of claim 19, wherein writing to each memory cell in the first group of the memory cell comprises modifying the flag cell associated with the first group of the memory cells to indicate that the first group of the memory cells has valid information.

21. The method of claim 18, further comprising erasing the memory cells of the first group of the memory cells when the memory circuit is not otherwise in operation.

22. The method of claim 18, wherein the plurality of memory cells and the plurality of flag cells comprise phase change memory (PCM) cells.

23. The method of claim 18, wherein the flag cell associated with each group of memory cells is stored with the group of memory cells.

24. The method of claim 18, wherein the flag cell associated with each group of memory cells is stored away from the group of memory cells.

25. The method of claim 24, wherein the flag cells are grouped into flag words in a flag matrix.

26. The method of claim 18, wherein each group of memory cells comprises a memory word.

27. An integrated circuit memory device comprising:
a plurality of memory cells formed on a substrate;
a plurality of flag cells formed on the substrate, wherein each flag cell is associated with a group of the memory cells; and
an integrated controller formed on the substrate, wherein the integrated controller is configured to set a flag cell to an erased value during an erase operation on a group of the memory cells associated with the flag cell without modifying the plurality of memory cells of the group.

28. The memory device of claim 27, wherein the plurality of memory cells and the plurality of flag cells comprise phase change memory (PCM) cells.

29. The memory device of claim 27, wherein each memory word comprises the flag cell associated therewith.

30. The memory device of claim 27, wherein the flag cell associated with each memory word is separated from the memory word to which it is dedicated.

31. The memory device of claim 27, wherein the plurality of flag cells are grouped together into flag words forming a flag matrix.

32. The memory circuit of claim 13, wherein
the memory cells comprise a plurality of error code correction (ECC) memory cells, and
each erase flag has two dedicated ECC memory cells.

33. The method of claim 18, further comprising performing error code correction (ECC) on the associated flag cell for each group of memory cells using dedicated ECC memory cells, each associated flag cell has two dedicated ECC memory cells.

34. The memory device of claim 27, further comprising a plurality of error code correction (ECC) memory cells formed on the substrate, wherein each flag cell of the plurality of flag cells has two dedicated ECC memory cells.

* * * * *